(12) United States Patent
Furuta

(10) Patent No.: US 8,618,669 B2
(45) Date of Patent: Dec. 31, 2013

(54) COMBINATION SUBSTRATE

(75) Inventor: Toru Furuta, Ogaki (JP)

(73) Assignee: Ibiden Co., Ltd., Ogaka-shi (JP)

( * ) Notice: Subject to any disclaimer, the term of this patent is extended or adjusted under 35 U.S.C. 154(b) by 0 days.

(21) Appl. No.: 12/174,212

(22) Filed: Jul. 16, 2008

(65) Prior Publication Data
US 2009/0174081 A1 Jul. 9, 2009

Related U.S. Application Data

(60) Provisional application No. 61/020,067, filed on Jan. 9, 2008.

(51) Int. Cl.
*H01L 23/52* (2006.01)

(52) U.S. Cl.
USPC .... 257/777; 257/686; 257/687; 257/E23.001; 257/E23.019

(58) Field of Classification Search
CPC .................................................. H01L 25/0657
USPC .................. 257/686, 659, 737, 777, E23.141, 257/E21.589, E23.002, E23.001, E23.114, 257/E23.019, E33.012, E25.006, E25.018, 257/E25.027, E23.085
See application file for complete search history.

(56) References Cited

U.S. PATENT DOCUMENTS

| | | | |
|---|---|---|---|
| 6,492,718 B2 * | 12/2002 | Ohmori | 257/686 |
| 7,618,849 B2 * | 11/2009 | Khan et al. | 438/127 |
| 7,989,707 B2 * | 8/2011 | Yamano et al. | 174/260 |
| 2001/0054758 A1 * | 12/2001 | Isaak | 257/686 |
| 2003/0057537 A1 * | 3/2003 | Iwasaki et al. | 257/684 |
| 2005/0017336 A1 * | 1/2005 | Kung et al. | 257/685 |
| 2006/0012021 A1 * | 1/2006 | Larson, et al. | 257/686 |
| 2006/0231939 A1 * | 10/2006 | Kawabata et al. | 257/686 |
| 2007/0018313 A1 * | 1/2007 | Gomyo et al. | 257/723 |
| 2008/0073769 A1 * | 3/2008 | Wu et al. | 257/686 |
| 2008/0258287 A1 * | 10/2008 | Kasuga | 257/686 |
| 2008/0290491 A1 * | 11/2008 | Yamano et al. | 257/686 |
| 2009/0140415 A1 * | 6/2009 | Furuta | 257/700 |

FOREIGN PATENT DOCUMENTS

| | | |
|---|---|---|
| JP | 06-163811 | 6/1994 |
| JP | 8-125053 | 5/1996 |
| JP | 8-250546 | 9/1996 |
| JP | 2001-085603 | 3/2001 |
| JP | 2001-210954 | 8/2001 |

(Continued)

OTHER PUBLICATIONS

U.S. Appl. No. 12/163,150, filed Jun. 27, 2008, Furuta.

*Primary Examiner* — Cuong Q Nguyen
*Assistant Examiner* — Yosef Gebreyesus
(74) *Attorney, Agent, or Firm* — Oblon, Spivak, McClelland, Maier & Neustadt, L.L.P.

(57) ABSTRACT

A combination substrate includes a first substrate having multiple wiring board mounting pads for installing a printed wiring board and multiple connection pads on the opposite side of the wiring board mounting pads, a second substrate having multiple package substrate mounting pads for loading one or more package substrates and multiple connection pads on the opposite side of the package substrate mounting pads, a resin component filling a space between the first substrate and the second substrate, and multiple component loading pads positioned to load an electronic component between the first substrate and the second substrate and formed on one of the first substrate and the second substrate. The connection pads of the second substrate are electrically connected to the connection pads of the first substrate.

15 Claims, 16 Drawing Sheets

(56) References Cited

FOREIGN PATENT DOCUMENTS

| JP | 2001-230515 | 8/2001 |
| JP | 2002-170851 | 6/2002 |
| JP | 2006-253587 | 9/2006 |
| JP | 2006-253588 | 9/2006 |
| JP | 2006-344787 | 12/2006 |
| JP | 2007-53235 A | 3/2007 |
| JP | 2008-91810 A | 4/2008 |

* cited by examiner (A)

(B)

(A)

(B)

(A)

(B)

COMBINATION SUBSTRATE

CROSS-REFERENCE TO RELATED APPLICATIONS

The present application claims the benefits of priority to U.S. Application No. 61/020,067, filed Jan. 9, 2008. The contents of that application are incorporated herein by reference in their entirety.

BACKGROUND OF THE INVENTION

1. Field of the Invention

The present invention relates to a combination substrate in order to mount a package substrate with a semiconductor element mounted thereon. In particular, it relates to a combination substrate wherein an electrical connection is made between package substrates and a substrate in POP (Package on Package) which is structured with at least two substrates.

2. Discussion of the Background

There have been demands for higher mounting densities for electronic components. The background to the demands is to secure mounting spaces within the limited substrate areas due to added and concentrated functions. They have been addressed when it comes to a cell phone, to illustrate, with a package substrate wherein two IC chips are laminated and the terminals of the IC chips and of the substrate are connected with wire-bonding, etc., and by turning that into a multistage package which is laminated with so-called package-on-package wherein a package is formed on a package for a component which has required a package substrate wherein two IC chips had been mounted.

Japanese Laid-Open Patent Publication No. Hei 6-163811, Japanese Laid-Open Patent Publication No. 2001-230515, Japanese Laid-Open Patent Publication No. 2001-85603, and Japanese Laid-Open Patent Publication No. 2001-210954 disclose multistage packages. The contents of these publications are incorporated herein by reference in their entirety.

SUMMARY OF THE INVENTION

According to one aspect of the present invention, a combination substrate includes a first substrate having multiple wiring board mounting pads for installing a printed wiring board and multiple connection pads on the opposite side of the wiring board mounting pads, a second substrate having multiple package substrate mounting pads for loading one or more package substrates and multiple connection pads on the opposite side of the package substrate mounting pads, a resin component filling a space between the first substrate and the second substrate, and multiple component loading pads positioned to load an electronic component between the first substrate and the second substrate and formed on one of the first substrate and the second substrate. The connection pads of the second substrate are electrically connected to the connection pads of the first substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
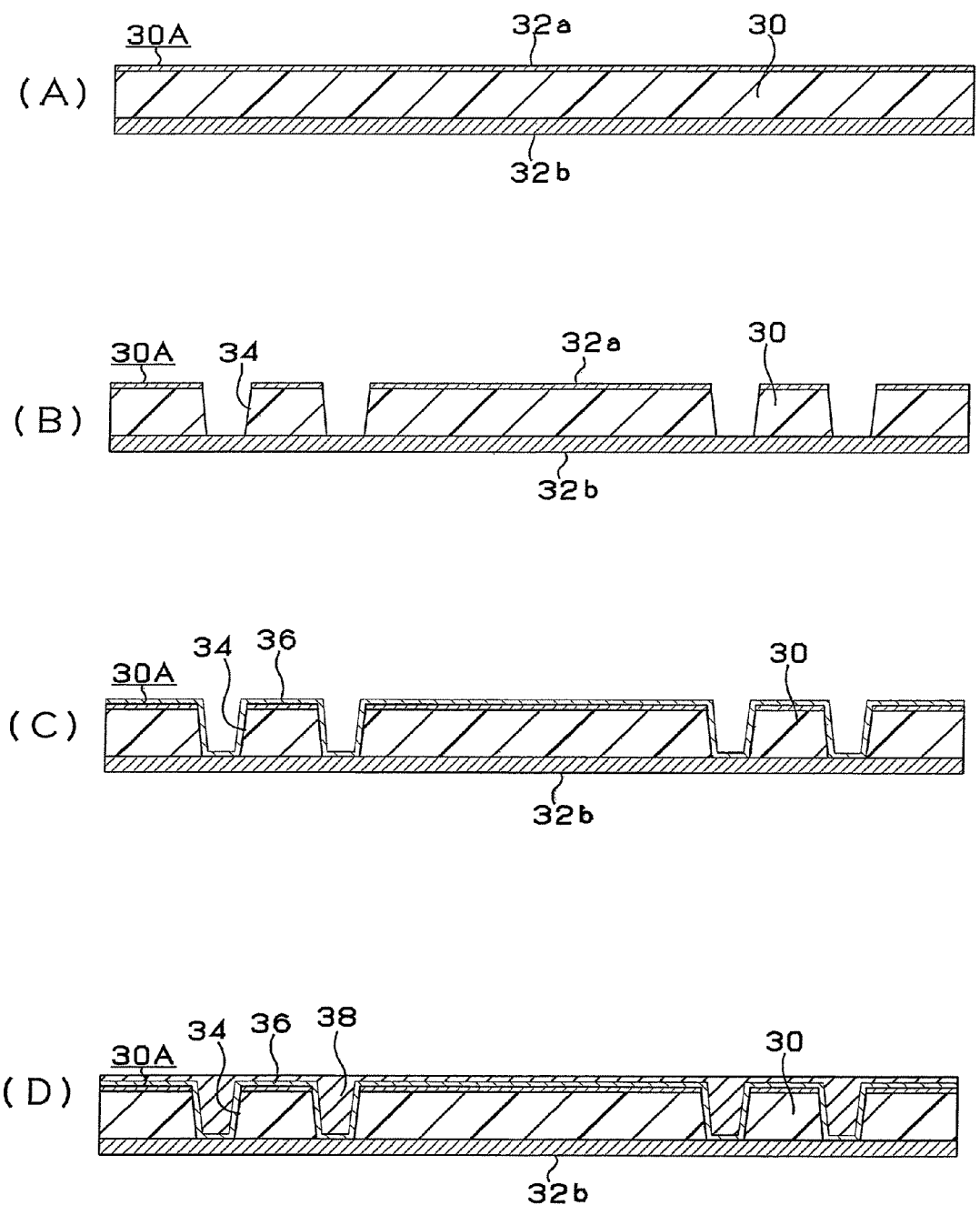
FIGS. 1A-1D are step drawings illustrating a method of manufacturing a combination substrate in accordance with Example 1.
Figure 2:
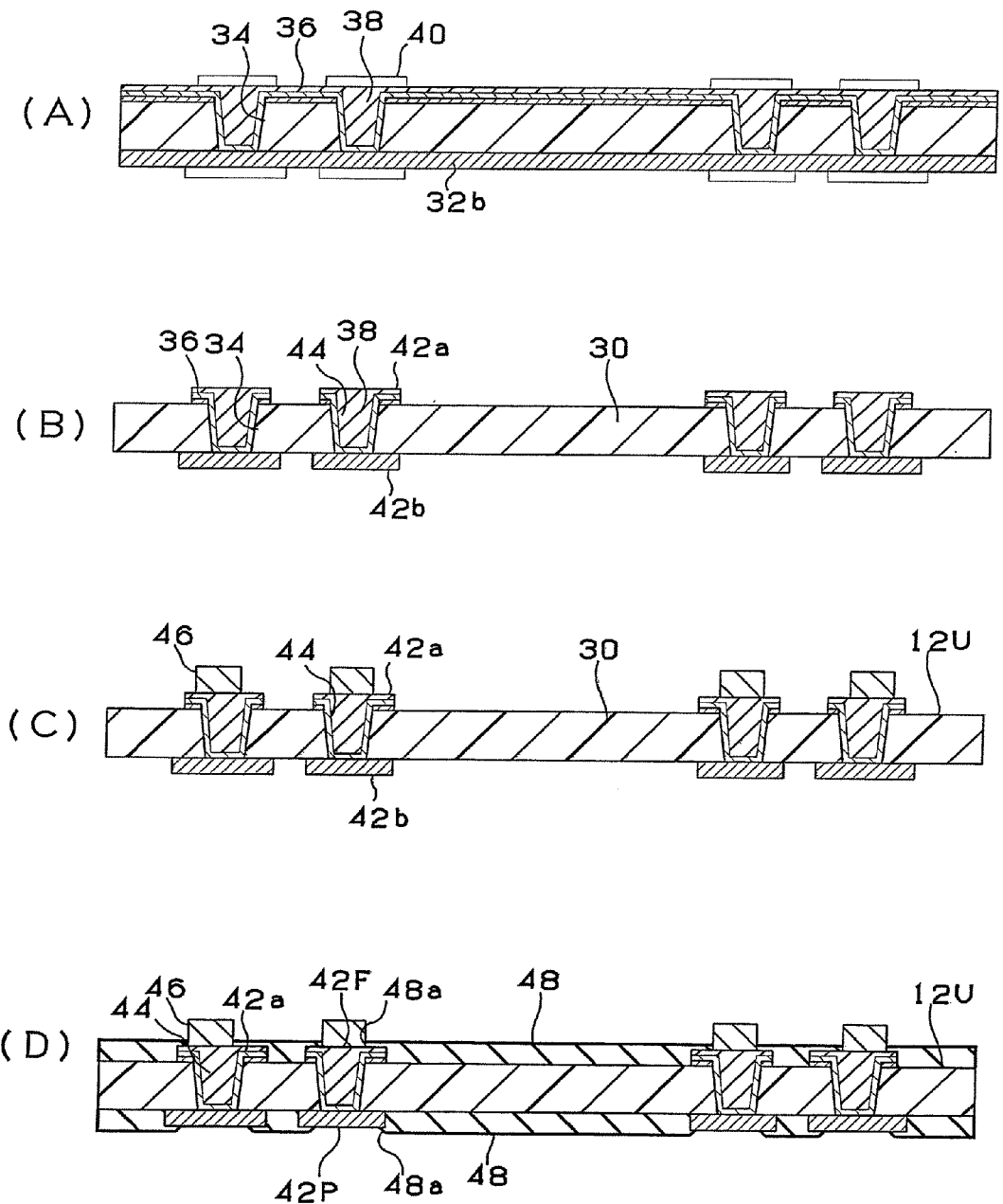
FIGS. 2A-2D are step drawings illustrating a method of manufacturing a combination substrate in accordance with Example 1.
Figure 3:
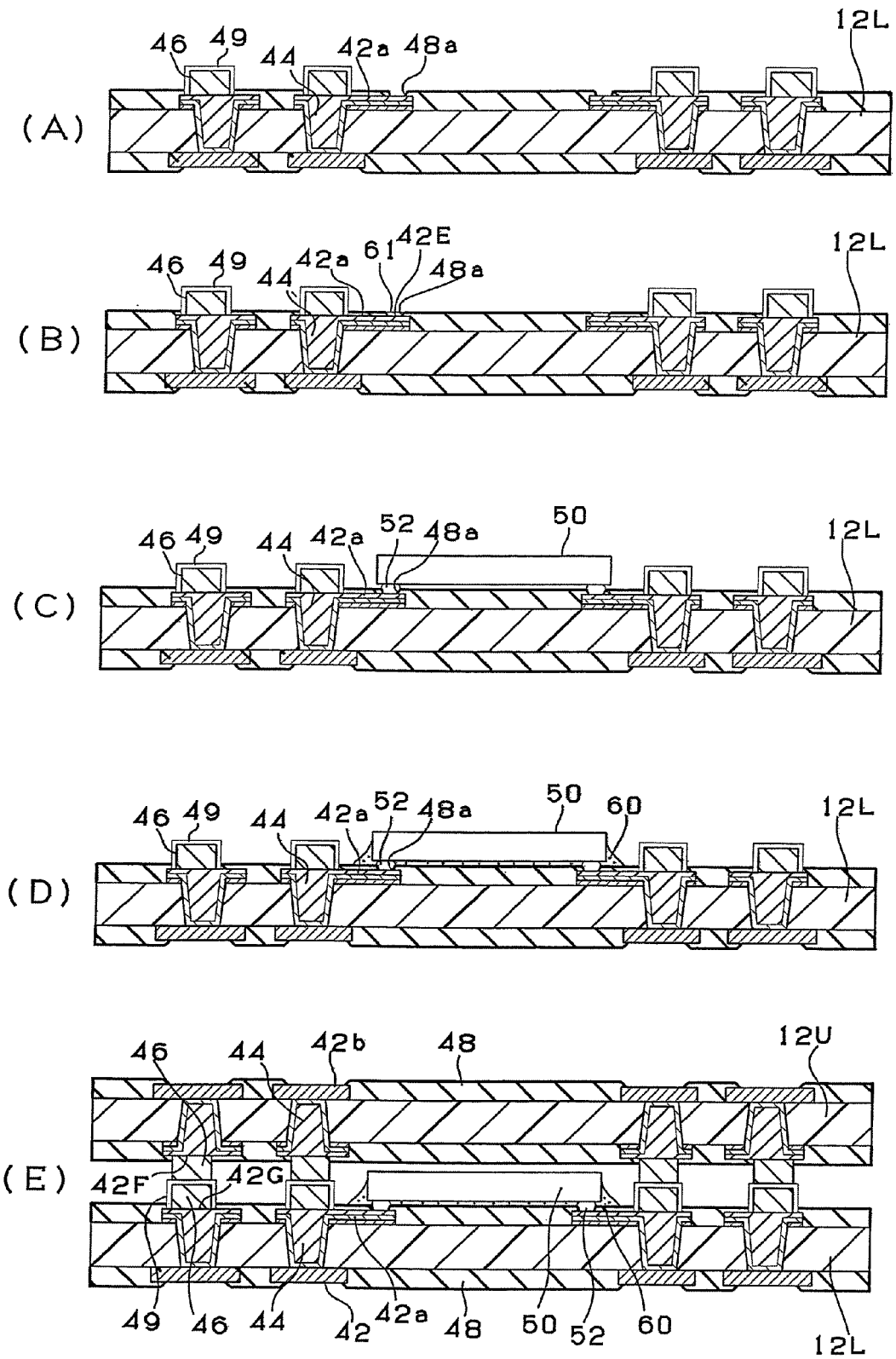
FIGS. 3A-3E are step drawings illustrating a method of manufacturing a combination substrate in accordance with Example 1.

The embodiments will now be described with reference to the accompanying drawings, wherein like reference numerals designate corresponding or identical elements throughout the various drawings.

EXAMPLE 1

Figure 6:
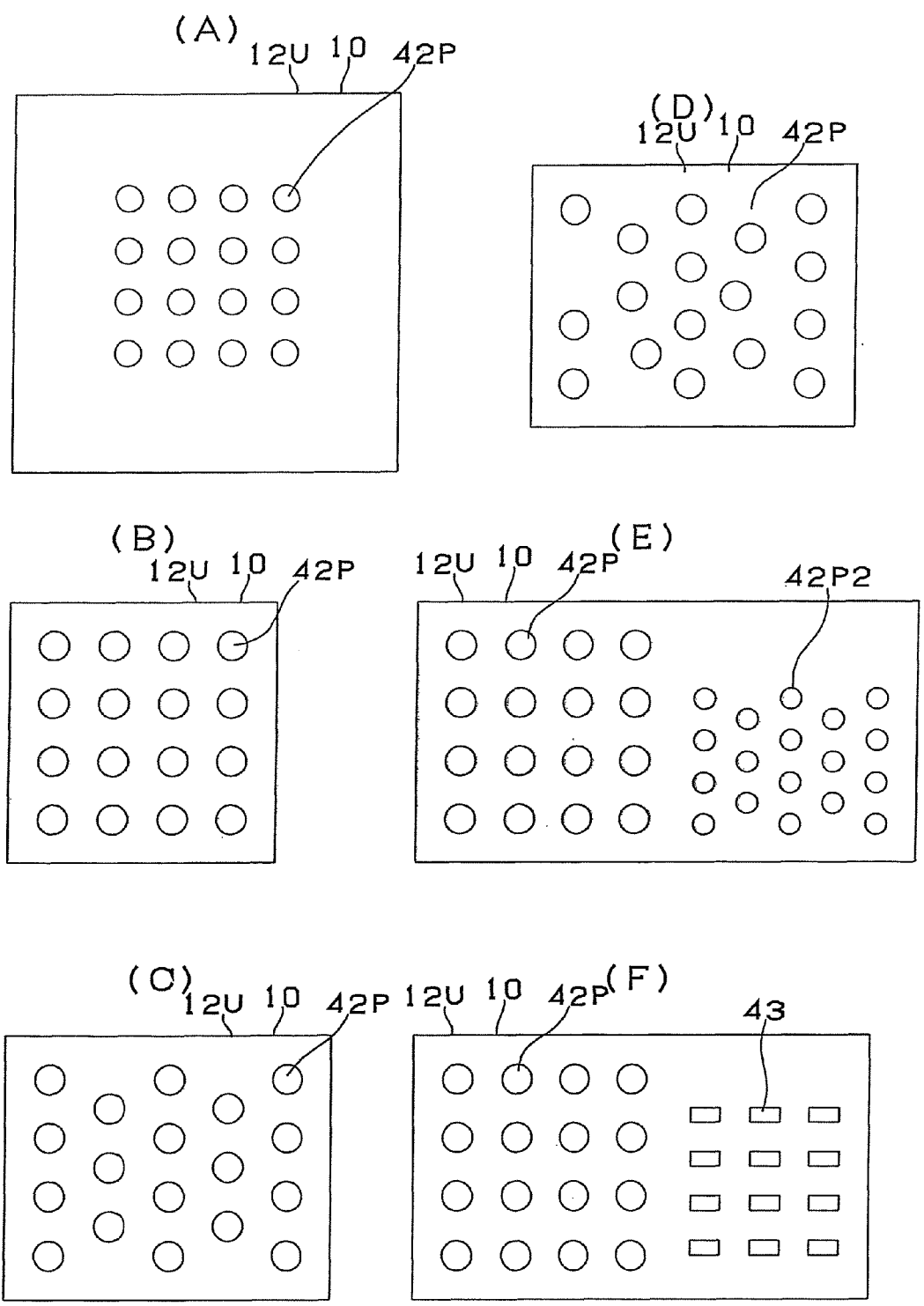
FIGS. 6A-6F are plan views illustrating the dispositions of pads for mounting a package substrate of a combination substrate in accordance with Example 1.

Formation of Connection Portion with Posts:

FIG. 4(A) illustrates a sectional view of a combination substrate 10 in accordance with Example 1. The combination substrate 10 comprises an upper substrate 12U and a lower substrate 12L. On the upper substrate 12U there are disposed a pad group of pads for package substrate connection 42P on the center portion of the upper substrate 12U, as illustrated in the plan view of FIG. 6(A) corresponding to the a arrow directional view in FIG. 4(A). On the lower substrate 12L there is likewise formed a pad group for external connection such as the BGA of pads 42D for connecting to another printed wiring board. On the upper face of the lower substrate 12L there is mounted an IC chip 50. As to the lower substrate 12L, conductor circuits 42b on the lower face and conductor circuits 42a on the upper face are connected via vias 44, and the IC chip 50 and the conductor circuits 42a on the upper face are connected via solder bumps 52. In this case, the IC chip 50 may be mounted by other mounting configurations (wire bonding mounting, for example). A plurality of IC chips may be mounted. In the opening portions 48a in a solder resist 8 of the conductor circuits 42a on the upper face side of the lower substrate 12L there is formed a pad group of pads 42G for upper substrate connection. In the opening portions 48a in a solder resist 48 of the conductor circuits 42 on the lower face side there is formed a pad group constituting pads 42D for printed wiring board connection.

Likewise, as to the upper substrate 12U, the conductor circuits 42a on the lower face side and the conductor circuits 42b on the upper face side are connected via vias 44. In the opening portions 42a in the solder resist 48 of the conductor circuits 42a on the lower face side of the upper substrate 12U there is formed a pad group of pads 42F for lower substrate connection, and in the opening portions 48a in the solder resist 48 of the conductor circuits 42b on the upper face side there is formed a pad group of pads 42P for package substrate connection. Between the lower substrate 12L and the IC chip 50 there is filled an insulating resin such as an underfill 60 such as an epoxy resin, and between the upper substrate 12U and the lower substrate 12L there is filled an insulating resin being a resin filler agent (underfill) 62. The underfill 60 and the resin filler agent 62 are preferably composed of a thermosetting resin and an inorganic filler. The pads 42F on the lower face side of the upper substrate 12U and the pads 42G on the upper face side of the lower substrate 12L are electrically connected via cylindrical metal posts 46, 46.

Figure 5:
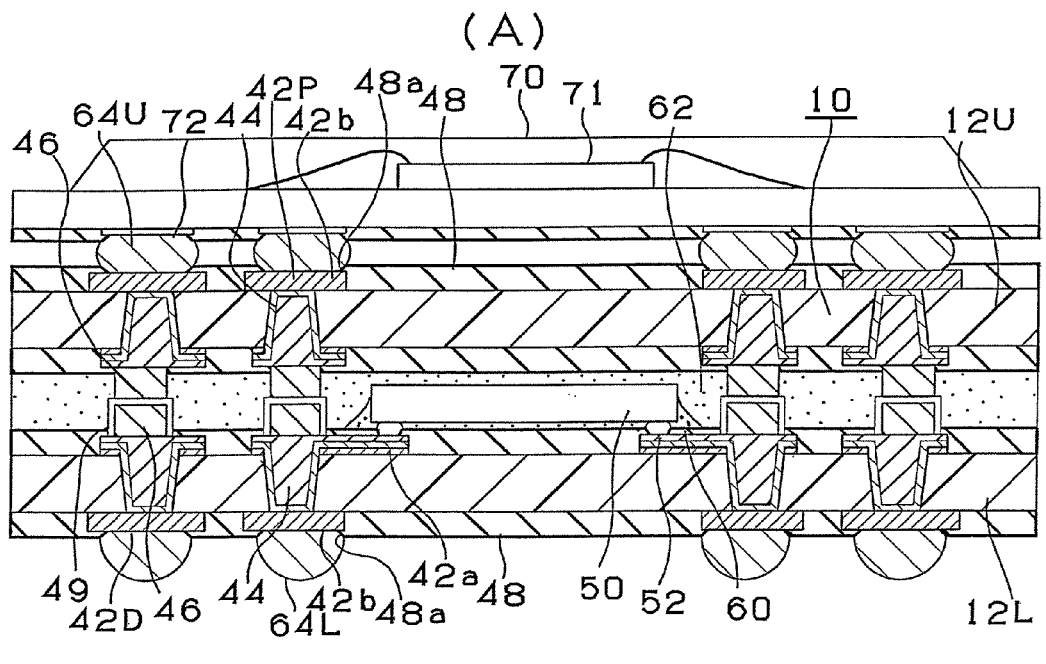
FIGS. 5A-5B are step drawings illustrating a method of manufacturing a combination substrate in accordance with Example 1.
Figure 5:
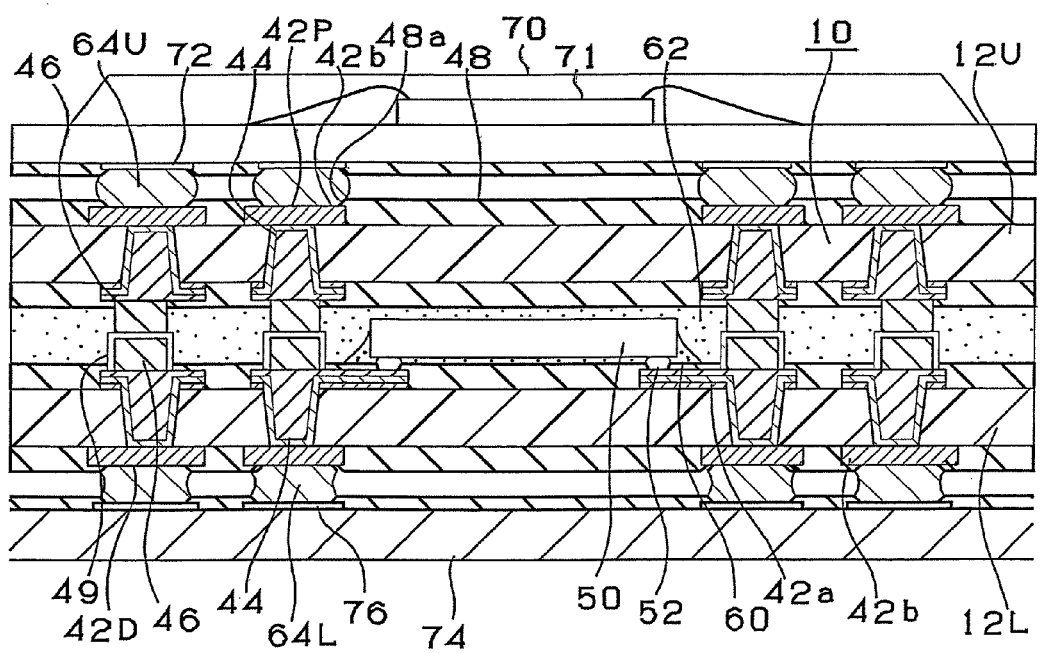

On the pads 42D on the lower face side of the combination substrate 10 there are provided external connection terminals 64L such as BGA and solder bumps, and by their being connected to pads 76 of another printed wiring board 74 as illustrated in FIG. 5(B) said combination substrate 10 is loaded onto the printed wiring board 74.

In the combination substrate 10 in Example 1, on account of the underfill 62 having been filled between the upper substrate 12U and the lower substrate 12L, it now becomes possible to control the warpage and separation of the upper substrate 12U and the lower substrate 12L and to ease stresses on account of the underfill 62 even when the upper substrate 12U and the lower substrate 12L are heated such that stresses are generated toward warpage and separation being generated.

And, it is speculated that the degradation rate due to the intrusion of moisture from a conductor portion and from the outside is slowed down under the reliability conditions allowing reliability to be readily secured on account of the resin filler (underfill) 62 filled between the upper substrate 12U and the lower substrate 12L.

Continuing on, steps for manufacturing a combination substrate in accordance with Example 1 with reference to FIG. 4(A) and FIG. 4(B) will be described with reference to FIG. 1 through FIG. 6.

A. Formation of Upper Substrate

1. Preparation of Substrate Material

A dual-sided copper-clad laminate board 30A wherein copper foils 32a, 32b are laminated on both faces is prepared. As for an insulating material 30, a use of one using mainly a resin material is preferred (FIG. 1(A)).

As an example for it, glass-epoxy resin, polyimide resin, phenol resin, BT resin, etc., can be mentioned. And, ceramic group materials, metal substrates, etc., could be applied. The thickness of an insulating material preferably falls between 60 and 300 µm. And, the thickness of a copper foil preferably falls between 5 and 30 µm. The top and bottom copper foils 32a, 32b may be the same in thickness or may vary in thickness. It may be that copper foils on a thick side are prepared and that the thickness of the copper foil may be adjusted at an appropriate time through a thin film processing such as etching.

2. Laser Hole Making

To obtain electrical connection within the dual-sided copper-clad laminate board 30A, a hole making processing is performed with laser to form openings 34 (FIG. 1(B)). Holes are made with a direct processing whereby laser is directly irradiated onto the upper face side copper foil 32a. As for laser, CO2 laser, etc., may be used. As for the irradiation conditions, the pulse energy is preferably within the range of 0.5 to 100 mJ, the pulse width within 1 to 100 µs, the pulse interval no less than 0.5 ms, the frequency within 2,000 to 3,000 Hz, and the shot count 1 to 10. Accordingly, it provides the copper clad laminate board 30A having openings 34 reaching the copper foil 32b on the lower face side which is subjected to laser.

3. Plating Film Formation

To have conductivity between the front and the back of the copper clad laminate board 30A having openings 34, a film is formed with plating. As to plating, an electroless plating film 36 is first formed (FIG. 1(C)), and an electroplating is formed. In this case, it may be formed only with electroless plating, or only with electroplating. Or, a film composed of a plurality of layers of them may be formed. It may, as necessary, be in the field shape of the plating film 38 being filled (FIG. 1(D)). This secures an electrical connectivity between the conductor layers on the front and the back of the copper clad substrate 30.

4. Wiring Pattern Formation

On the conductor layer following the formation of a plating film, a resist layer is provided. A mask on which a wiring layout pattern, etc., is drawn is placed on the resist layer and on the conductor layer 38 and the copper foil 32b there are formed resist layer formation portions 40 and resist layer non-formation portions through light convergence and development (FIG. 2(A)). Then, the conductor layer corresponding to the resist layer non-formation portions are eliminated by undergoing an etching treatment step with an etchant such as ferric chloride. Then, by stripping the resist layer with an alkaline solution, a dual-sided circuit board 30 having wiring patterns 42a, 42b, and vias 44 on the substrate is formed (FIG. 2(B)).

5. Metal Post Formation

On the wiring patterns 42a there are formed metal posts 46 (FIG. 2(C)). The shape of the metal posts 46 is preferably a cylinder. As for other shapes, a quadrangular prism, a polyangular prism that is no less than pentagonal, etc., may be used. As to a metal layer used for a post, a conductive metal such as copper, nickel, gold, and silver may be used. Copper as a principal component is preferred in terms of electrical property and reliability. The height of a metal post is preferably 5 to 50 µm. With this the upper substrate 12U is formed.

To connect posts, a conductive adhesive, solder, etc., may be used. Depending on the case, the same metal joining may be performed. That results in the upper substrate 12U having metal posts 46. And, metal posts 46 may be formed by forming an insulating layer having openings and removing the insulating layer after electroplating is filled inside the openings. As to the upper substrate 12U, to protect conductor circuits 42 a solder resist layer 48 may be formed as necessary (FIG. 2(D)). That being the case, the upper substrate 12U has on the face on the lower substrate side (the upper side in the figure) a pad group of pads 42F for connecting with the lower substrate by the openings 48a of the solder resist layer 48. On the face opposite the lower substrate (the lower side in the figure) there are formed a pad group of pads 42P for connecting to the package substrate by the openings 48a *of the solder resist layer* 48.

B. Formation of Lower Substrate

Steps 1 through 5 for the upper substrate apply likewise.

6. A solder layer 49 is formed on metal posts 46 (FIG. 3(A)). A solder layer 49 may be formed with solder plating, printing, transfer method, etc. For solder, a metal with Sn/Pb, Sn/Ag, Sn/Sb, Sn/Ag/Cu, etc., as a principal component may be used. As an example of the formation of a solder layer, electroless solder plating may be mentioned. After those other than the posts are coated with a resist, etc., such that a solder layer would not be formed, a catalyst such as Pd is added to the posts. Then, it is immersed in a plating solution with Sn/Pb being 9:1 and containing therein a reducer and a complex. That forms the solder layer 49 such that the posts 46 are coated. The thickness of the solder layer is preferably 5 to 15 μm. A necessary amount needs to be placed on the metal posts. At that time, the circuits of the lower substrate connecting with the upper substrate are disposed such that they are positioned at the same place as the lower substrate. Then, the joining is made during the joining step, and it is set up such that an electrical connection is made between the circuits.

7. IC Chip Mounting

On the pads 42E of the lower substrate 12L for connecting with the IC chip there is formed a solder layer 61 for solder bumps (FIG. 3(B)). The solder layer is preferably formed with printing, etc. With the solder bumps 52 thereof and the metal bumps formed on the IC chip the IC chip 50 is flip-chip mounted through reflow (FIG. 3(C)). Then, the underfill 60 is filled in a gap between the IC chip 50 and the lower substrate 12L (FIG. 3(D)). With this, a mounted substrate (lower substrate 12L) on which the IC chip has been mounted is formed. For the underfill 60, either of a thermosetting resin or a photosensitive resin may be used. Specifically, a resin composed of one or more kinds of resins such as epoxy resin, polyimide resin, phenol resin, etc., may be used. Inorganic, etc., particulates may be contained in those resins.

And, it may be that which is wire-bonding mounted, in lieu of flip-chip mounted, and sealed. And, two or more IC chips may be mounted and a passive component such as a capacitor may be mix-loaded.

C. Formation of Joined Substrate with Lower Substrate and Upper Substrate

1. Alignment of Lower Substrate and Upper Substrate

The circuits (pads) 42G of the lower substrate 12L and the circuits (pads) 42F of the upper substrate 12U are aligned. At that time, the joining is done such that the posts 46 of the upper substrate 12U are pressed onto the posts 46 of the lower substrate 12L, on which solder 49 is formed (FIG. 3(E)). Then, the conductor circuits (pads) 42G of the lower substrate 12L and the conductor circuits (pads) 42F of the upper substrate 12U are connected via the posts 46, 46 by reflow. At that juncture, the end faces of the upper substrate 12U and of the lower substrate 12L are in a linear configuration. The connection portions (pads) 42G, 42F of the conductor circuits connected via the posts 46, 46 are preferably set in by 50 μm off the end faces of the combination substrate. Being set in by 50 μm results in the electrical connectivity and the connection reliability of the connection portions being secured. When the upper substrate 12U and the lower substrate 12L are viewed with the mid portion of the connection portions as an axis, the circuit portions of the connection portions are set being of a mirror surface structure (the top and bottom symmetrical structure).

2. Resin Fill Between Substrates

A filler resin (underfill) 62 is filled between the upper substrate 12U and the lower substrate 12L (FIG. 4(A)). That being the case, it is preferred that the end faces of the filler resin (underfill) 62 is also in a linear configuration with respect to the substrates. As for a resin to be filled between the substrates, either of a thermosetting resin, a thermoplastic resin, or a photosensitive resin may be used. Specifically, a resin composed of one or more kinds of resins such as epoxy resin, polyimide resin, phenol resin, etc., may be used. Inorganic, etc., particulates may be contained in those resins. And, it may be the same resin as or a different resin from the underfill 60.

Figure 4:
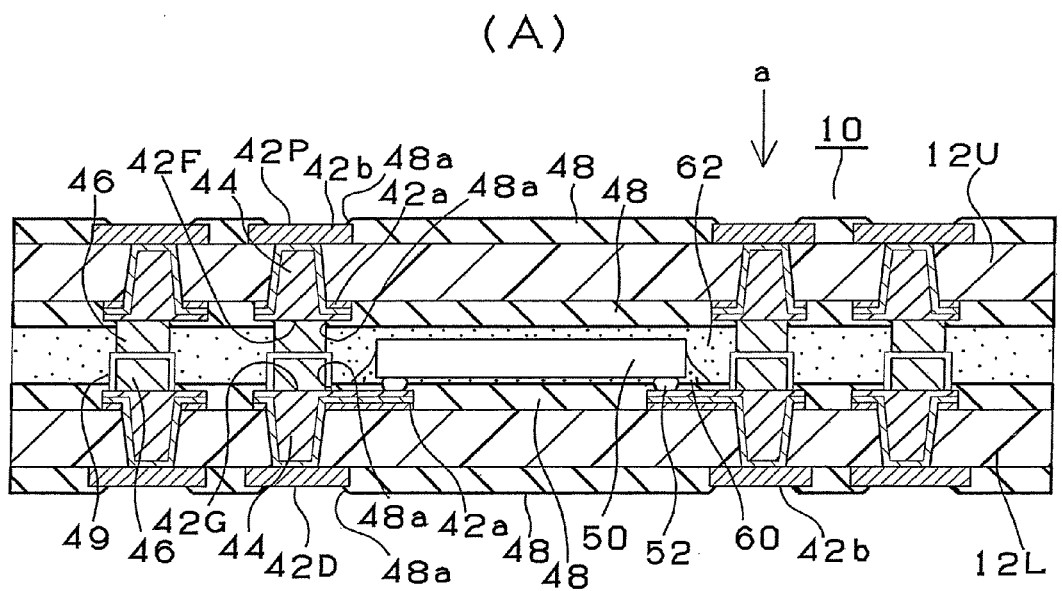
FIGS. 4A-4B are step drawings illustrating a method of manufacturing a combination substrate in accordance with Example 1.
Figure 4:
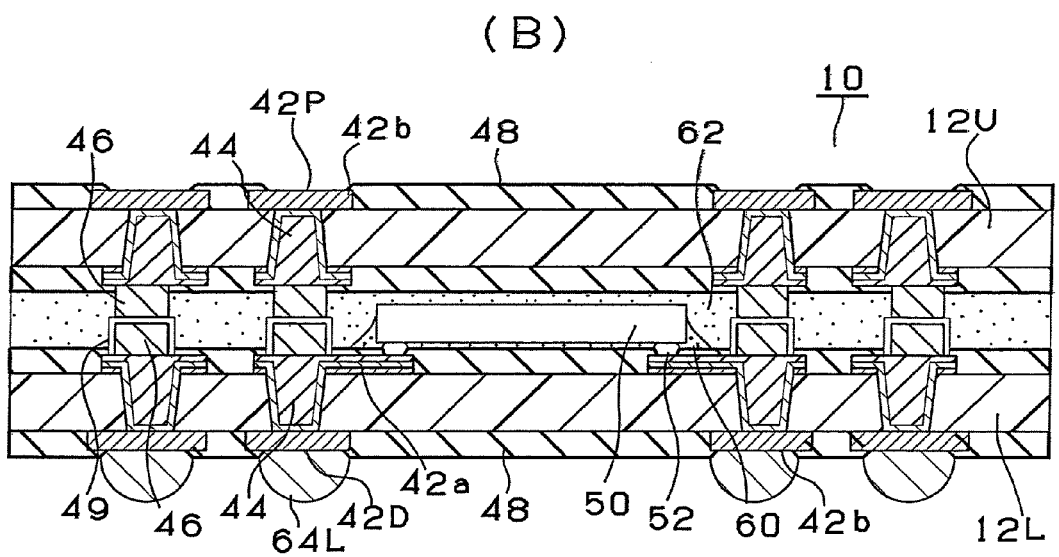

As necessary, solder bumps 64L may be formed on the pads 42D of the lower substrate 12L (FIG. 4 (B)). On the pad group of the pads 42P on the upper portion of the upper substrate 12U, a package substrate 70 with an IC chip 71 embedded therein or mounted thereon may be mounted (FIG. 5 (A)). That provides a laminate package substrate structure having two or more IC chips 50, 71. While solder bumps or BGA was herein used as external terminals, connections pins (PGA) may be used. And, it can be connected to the pads 72, 76 of the package substrate 70 and the printed wiring board 74 via solder bumps 64U, 64L or a BGA formed on the pad group of the pads 42P, 42D of the upper substrate 12U and the lower substrate 12L, allowing said combination substrate 10 to be connected to the package substrate 70 and the printed wiring substrate 74 (FIG. 5 (B)).

As to the example described above with reference to FIG. 6(A), the pad group of the pads 42P for package substrate mounting may be formed round and disposed in the center region or the outer peripheral region of the upper substrate 12U. This allows a package substrate with the external terminals such as a BGA disposed to be placed only in the center region or the outer-peripheral region.

As illustrated in FIG. 6(B), FIG. 6(C), the pad group of the pads 42P for package substrate mounting may be disposed on nearly the entirety of the face of the upper substrate 12U. This allows a package substrate with the external terminals such as a BGA being disposed in a full grid pattern to be placed.

As illustrated in FIG. 6(B), FIG. 6(C), the pad group of the pads 42P for package substrate mounting may be disposed evenly-spaced and regularly.

As illustrated in FIG. 6(B), the pad group of the pads 42P for package substrate mounting may be disposed in a matrix pattern.

As illustrated in FIG. 6(C), the pad group of the pads 42P for package substrate mounting may be disposed in a lattice pattern.

As illustrated in FIG. 6(D), the pad group of the pads 42P for package substrate mounting may be disposed randomly.

And, further, as to the pad group of the pads for package substrate mounting, there may be provided two types of pads 42P, 42P2 for mounting two or more package substrates (see FIG. 6(E)). This allows two or more package substrates to be loaded.

Further, as illustrated in FIG. 6(F), on the upper substrate 12U there may also be provided pads 43 for electronic component mounting along with pads 42P. It allows a package substrate on which an IC chip is mounted and a passive component such as a capacitor to be mix-loaded on the upper substrate.

Figure 7:
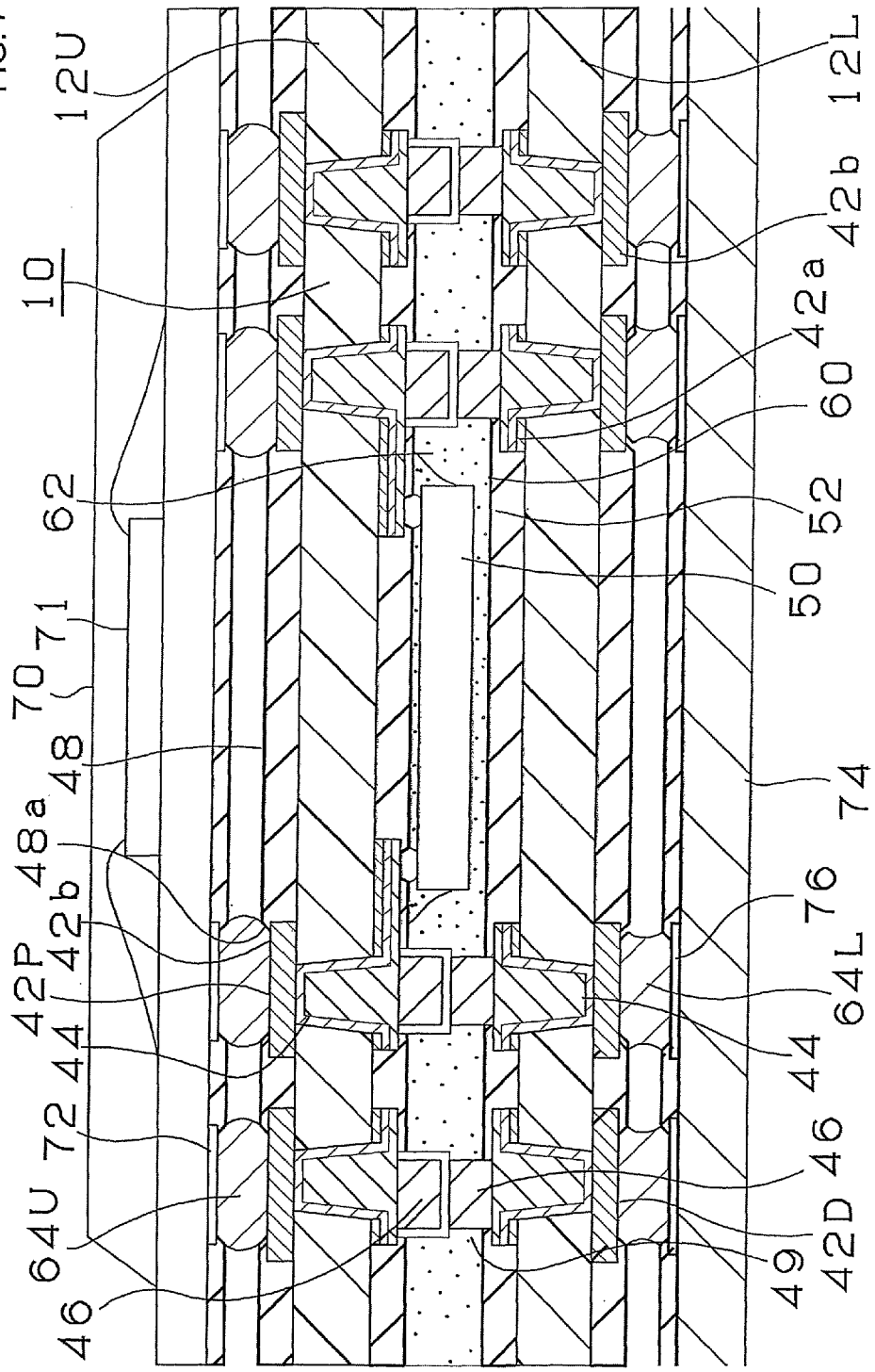
FIG. 7 is a sectional view illustrating a section of a combination substrate pertaining to Revised Example 1 of Example 1.

FIG. 7 illustrates a combination substrate pertaining to Revised Example 1 of Example 1. With Example 1, an IC chip 50 was mounted on the upper face of the lower substrate 12L as illustrated in FIG. 5(B). In lieu of this, an IC chip may also be mounted on the lower face of the upper substrate 12U, as illustrated in FIG. 7.

Figure 8:
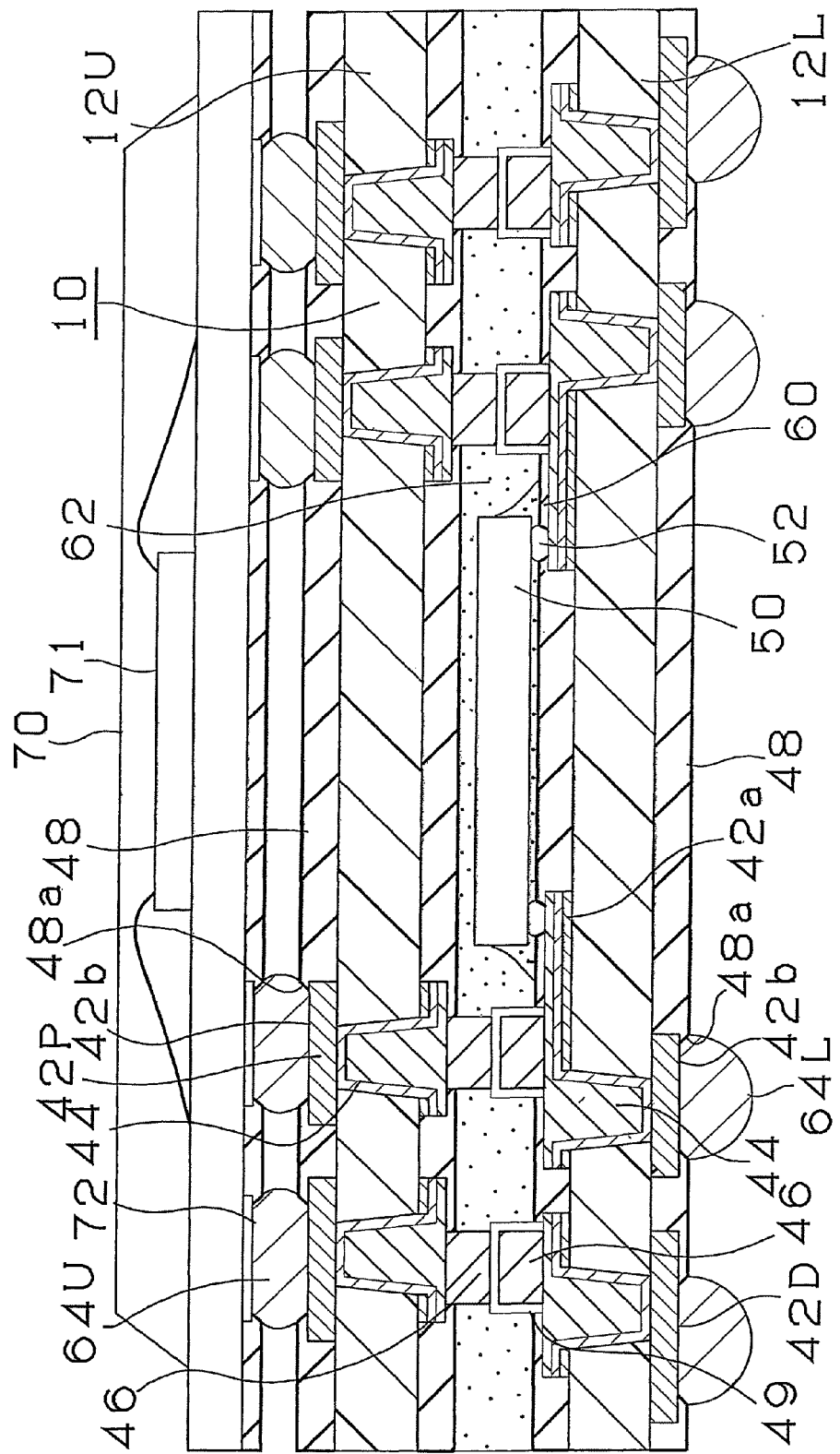
FIG. 8 is a sectional view illustrating a section of a combination substrate pertaining to Revised Example 2 of Example 1.

FIG. 8 illustrates a combination substrate pertaining to Revised Example 2 of Example 1. With Example 1, the upper substrate 12U and the lower substrate 12L were set up such that they were of a mirror surface structure. In lieu of this, it may be disposed such that vias 66 and circuits 42b of the lower substrate 12L spread out (fan out) as illustrated in FIG. 8.

EXAMPLE 2

Laminate Having an Interposer

Figure 12:
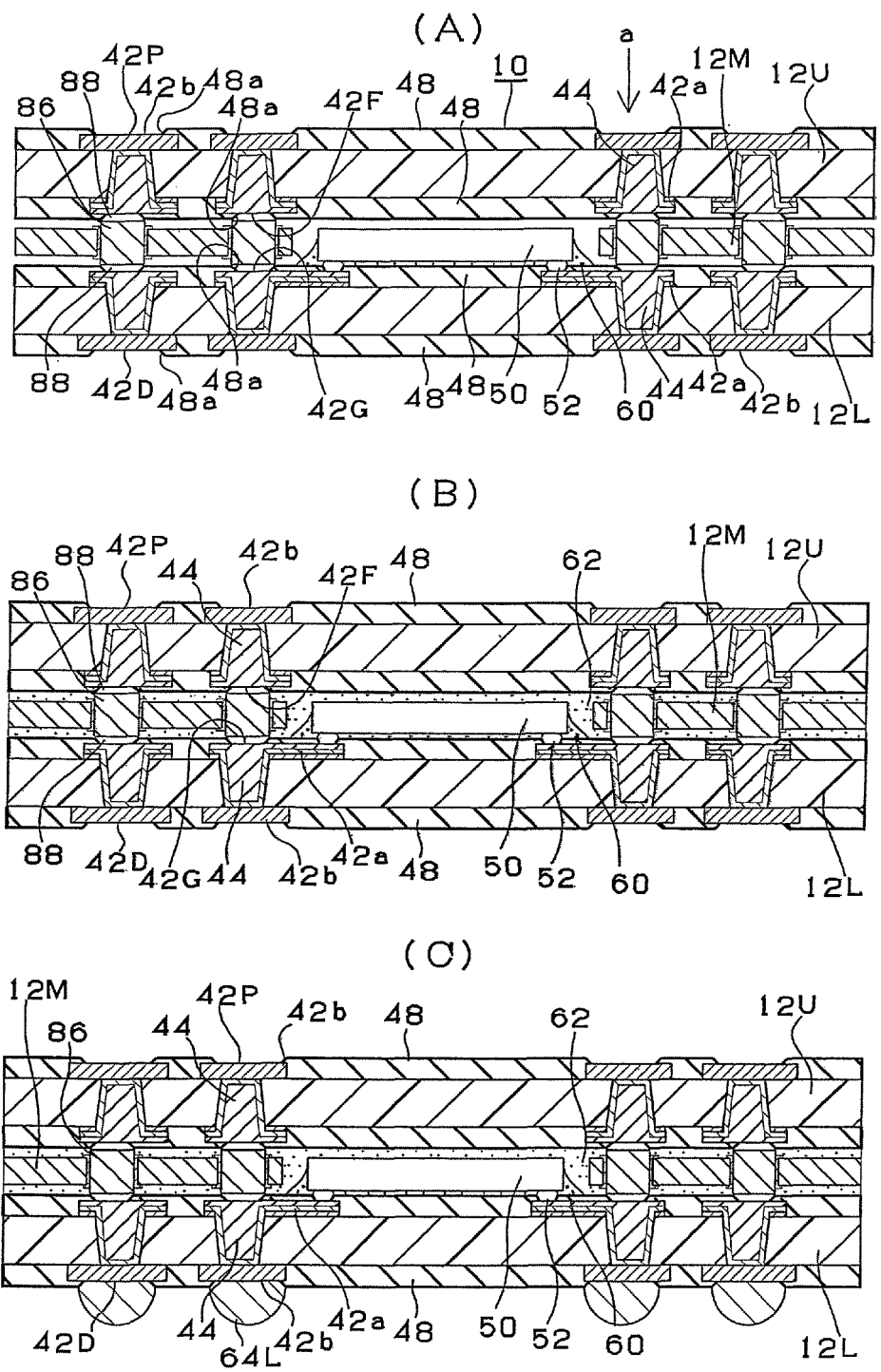
FIGS. 12A-12C are step drawings illustrating a method of manufacturing a combination substrate in accordance with Example 2.

FIG. 12(A) illustrates a sectional view of the combination substrate 10 in accordance with Example 2. The combination substrate 10 comprises an upper substrate 12U, an interposer 12M being an intermediate material, and a lower substrate 12L. On the upper substrate 12U, a pad group of pads 42P for package substrate connection is disposed in the center region of the upper substrate 12U, as illustrated in the plan view of FIG. 14(A) corresponding to the arrow directional view in FIG. 12(A). On the lower substrate 12L there is likewise formed a pad group of pads 42D to connect to a printed wiring board. On the upper face of the lower substrate 12L there is mounted an IC chip 50. As to the lower substrate 12L conductor circuits 42b on the lower face side and conductor circuits 42a on the upper face side are connected vias 44, and the IC chip 50 and the conductor circuits 42b on the upper face side are connected via solder bumps 52. In openings 48a in a solder resist 48 on the conductor circuits 42a on the upper face side of the lower substrate 12L there are formed pads 42G for the upper substrate connection, and in openings 48a in a solder resist 48 on conductor circuits 42b on the lower face side there are formed a pad group of pads 42D for printed wiring substrate connection.

Likewise, as to the lower substrate 12L the conductor circuits 42a on the lower face side and the conductor circuits 42b on the upper face side are connected vias 44. In openings 48a in the solder resist 48 on the conductor circuits 42a on the lower face side of the upper substrate 12U there are formed pads 42F for the lower substrate connection, and in openings 48a in the solder resist 48 on the conductor circuits 42b on the upper face side there are formed pads 42P for package substrate connection. Between the lower substrate 12L and the IC chip 50 there is filled underfill 60 being an insulating resin, and between the upper substrate 12U and the lower substrate 12L there is filled a resin filler (underfill) 62. The pads 42F on the lower face side of the upper substrate 12U and the pads 42G on the upper face side of the lower substrate 12L are electrically connected with cylindrical metal posts 86 of the interposer 12M.

Figure 13:
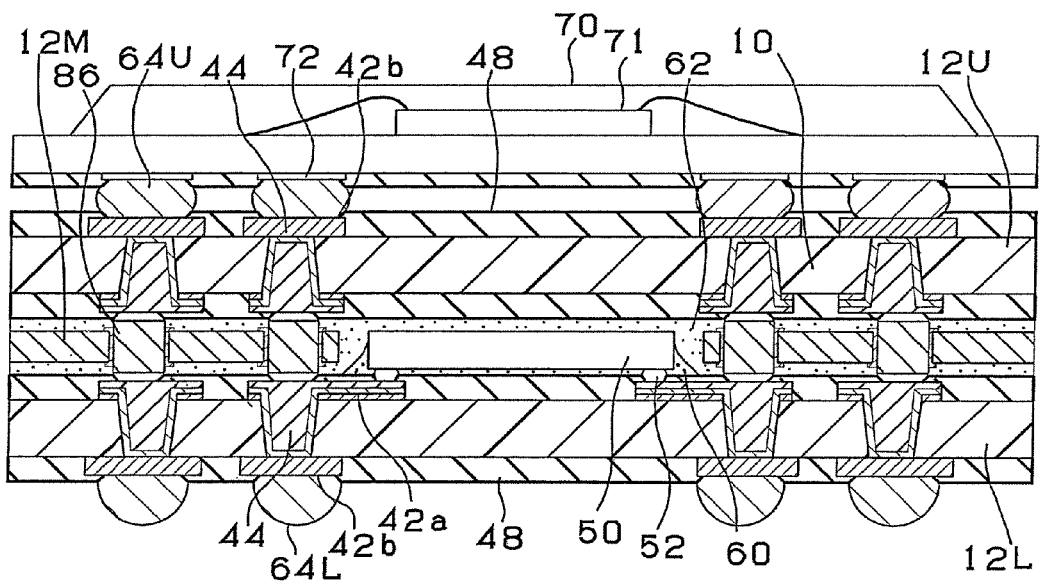
FIGS. 13A-13B are step drawings illustrating a method of manufacturing a combination substrate in accordance with Example 2.
Figure 13:
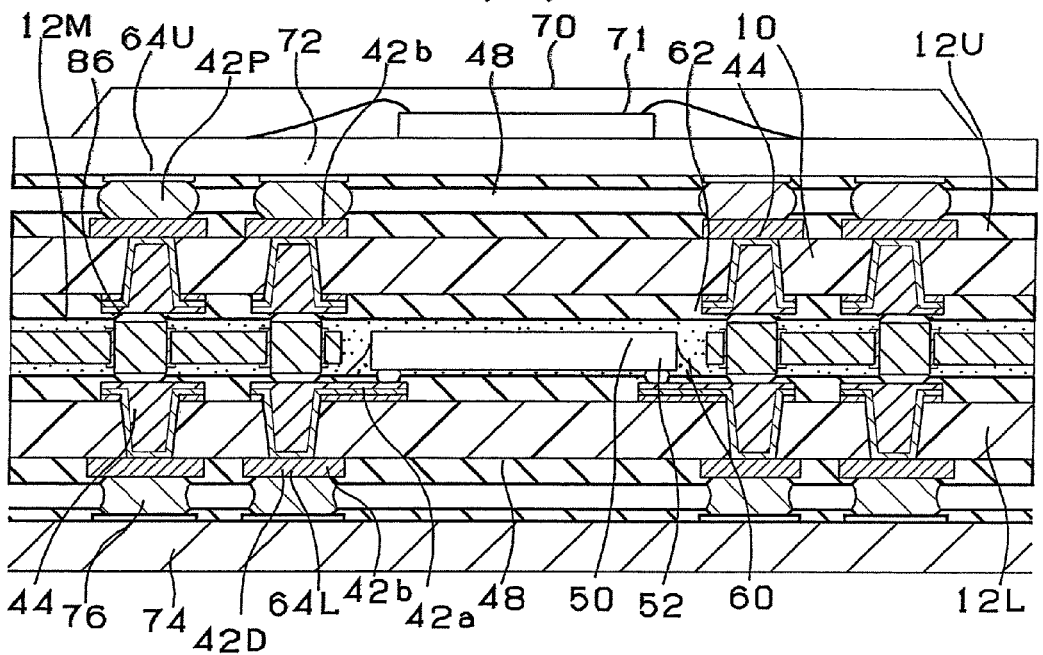

As illustrated in FIG. 13(B), there are provided solder bumps 64L or a BGA on the pads 42D on the lower face side of the combination substrate 10 which are connected to a pad group of pads 76 of the printed wiring board such that said combination board 10 is loaded onto the printed wiring board 74.

In the combination substrate 10 in Example 2, on account of the underfill 62 having been filled between the upper substrate 12U and the lower substrate 12L, it now becomes possible to control the warpage and separation of the upper substrate 12U and the lower substrate 12L and to ease stresses on account of the underfill 62 even when the upper substrate 12U and the lower substrate 12L are heated such that stresses are generated toward warpage and separation being generated.

And, it is speculated that the degradation rate due to the intrusion of moisture from a conductor portion and from the outside is slowed down under the reliability conditions allowing reliability to be readily secured on account of the resin filler (underfill) 62 filled between the upper substrate 12U and the lower substrate 12L.

A. Formation of Upper Substrate

Figure 9:
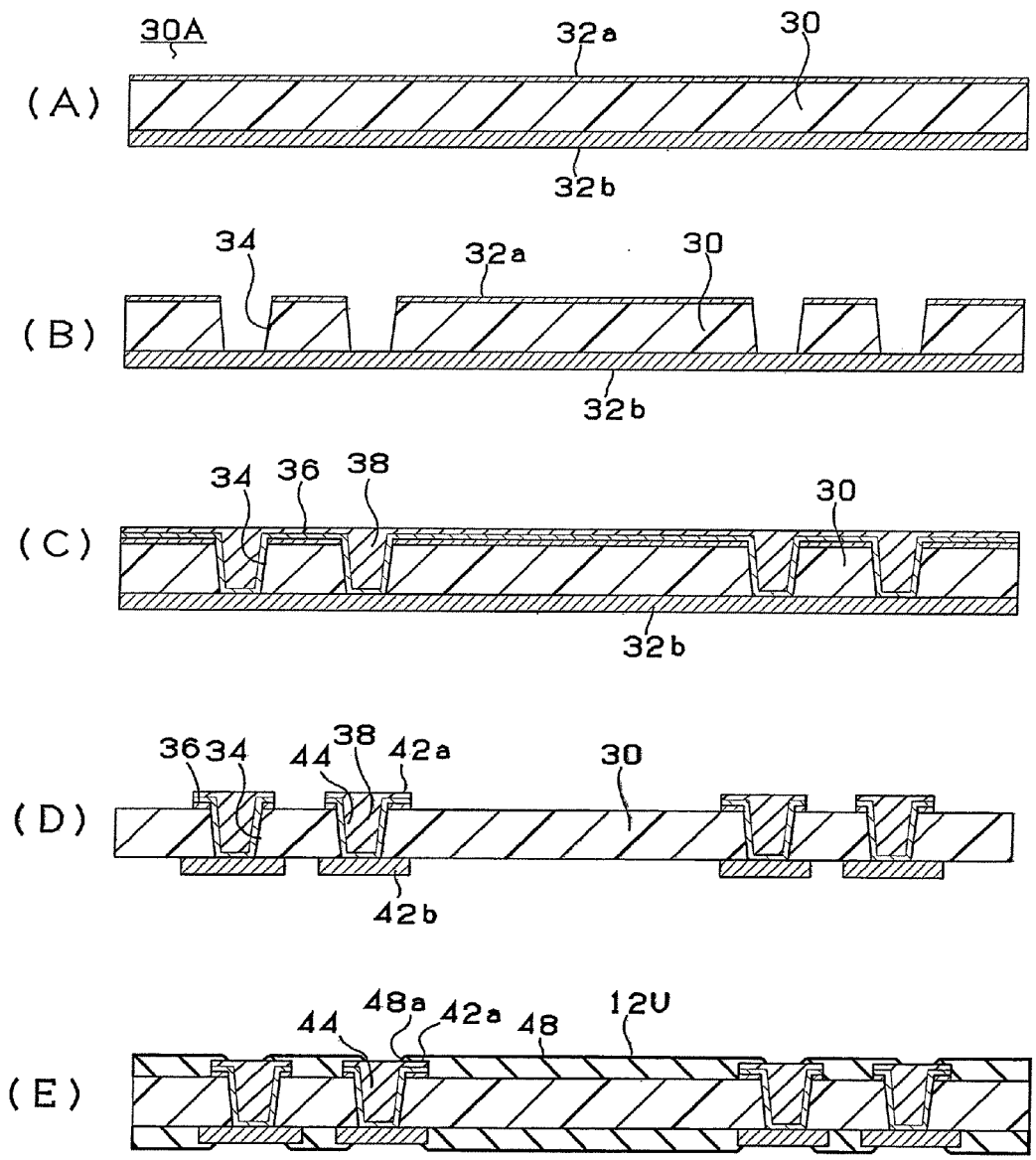
FIGS. 9A-9E are step drawings illustrating a method of manufacturing a combination substrate in accordance with Example 2.

Upper substrate 12U is formed following the steps likewise 1 through 4 under Example 1 (FIG. 9).

B. Formation of Lower Substrate

Figure 10:
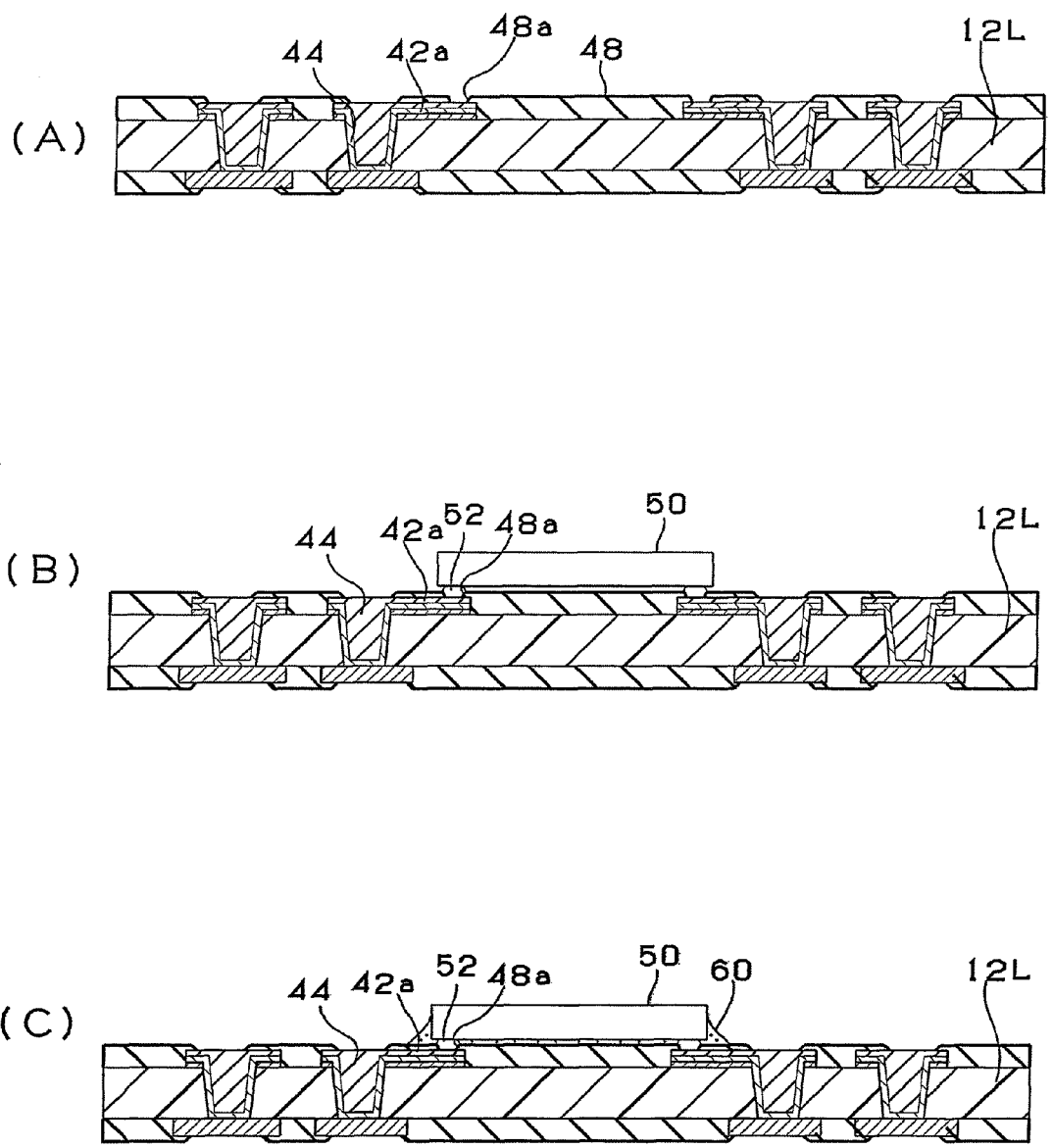
FIGS. 10A-10C are step drawings illustrating a method of manufacturing a combination substrate in accordance with Example 2.

Steps 1 through 4 under Example 1 apply likewise (FIG. 10(A)). Then, with the mounting step for the IC chip 50 having been performed, the lower substrate 12L with the IC chip 50 mounted can be obtained (FIG. 10(B), FIG. 10(C)).

C. Formation of an Interposer

Figure 11:
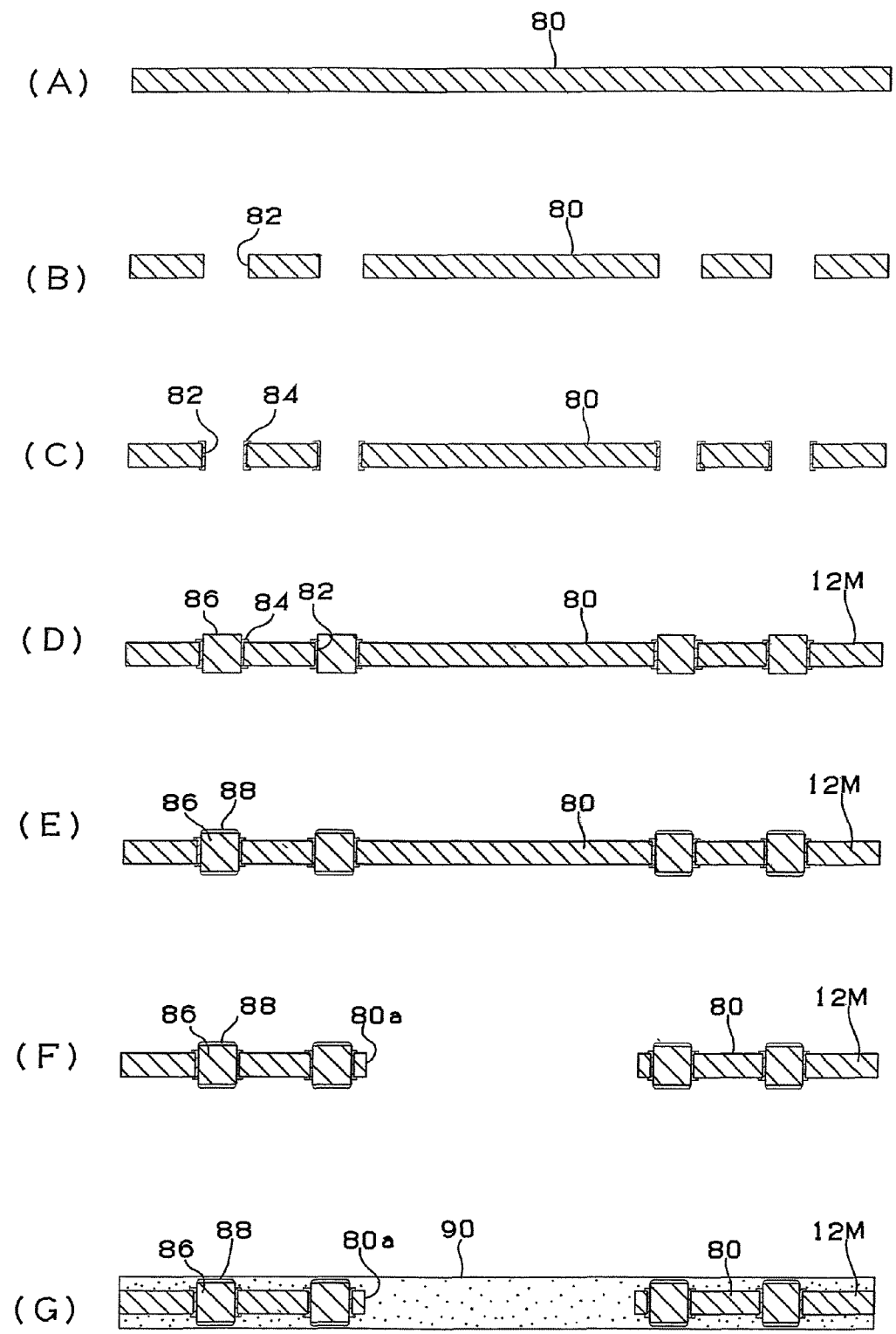
FIGS. 11A-11G are step drawings illustrating a method of manufacturing a combination substrate in accordance with Example 2.

An insulating material 80 is prepared (FIG. 11(A)). Openings 82 penetrating the insulating material 80 are formed (FIG. 11(B)), and a conductor layer 84 is formed in said openings 82 (FIG. 11(C)). The conductor layer 84 is formed by the through-hole, via, and post such as implant. For a conductor layer, a metal such as Cu, Ni, and a precious metal may be used.

As an example therefor, a method of filling a post with an implant is available. An insulating substrate having on both faces a conductor layer formed with a copper foil, plating, etc., is prepared. Openings for penetration are provided in the insulating substrate with drilling or laser. Then, a resist layer is provided on the entirety of the face of the conductor layer, and a mask with the wiring pattern drawn thereon is placed. Following that, a pattern for the interposer is formed through an etching treatment after having undergone exposure and development. Then, a solder resist layer may be formed or the external shape may be treated (single-piece treatment of interposer), as necessary. This results in the preparation of an insulating substrate having openings for implant.

Implant material to constitute posts for implant is prepared. The thickness (height) thereof is preferably greater than that of the insulating substrate. A lower jig for the implant step is placed in advance underneath the implant material. At that time, an upper jig having a protrusion shape and for punching is placed over the implant material. The upper jig is punched part way down the implant material.

The punched-out implant material is inserted and tapped into the openings 82 of the insulating substrate 80 which had been prepared such that the conductor layer (posts) 86 penetrating the insulating substrate is formed (FIG. 11(D)). Then, they are severed from the implant material and the height of a plurality of posts 86 protruding from the insulating substrate 80 is evened out. This allows the insulating substrate 80 being the interposer 12M to make an electrical connection between the front and the back and to have conductor layer (posts) 86 being nearly the same in height of the protrusions off the insulating substrate 80. At that time, an adhesive 88 may be applied, etc., as necessary, to affix the posts 86 being the conductor layer (FIG. 11(E)). And, the tip portions of the conductor layer may undergo steps for improving anti-oxidation and the connection of the substrate with the conductor layer (roughened face formation, mirror surface treatment, etc.). Further, a via hole 80a allowing an interference with the IC chip to be avoided could be formed (FIG. 11(F)). This allows the preparation of an interposer 12M to be sandwiched between the upper substrate and the lower substrate.

C. Formation of Laminate Substrate

1. Alignment of Lower Substrate and Upper Substrate

The circuits (pads) 42G of the lower substrate 12L, posts 86 of the interposer 12M, and the circuits (pads) 42F of the upper substrate 12U are aligned (FIG. 12(A)). At that time, the circuit portions 42G of the lower substrate 12L and the conductor layers 86 of the interposer 12M are brought in mutual contact. The circuit portions 42F of the upper substrate 12U and the conductor layers 86 of the interposer 12M are brought in mutual contact. That allows the upper substrate 12U and the lower substrate 12L to be electrically connected via the interposer 12M. The conductor layers 86 and the conductor layers 42G, 42F of each of the substrates may be connected with the use of solder, etc., as a conductive adhesive 88. At that time, when the upper substrate and the lower substrate are viewed with the center portion of the interposer as the axis, the circuit portions of the connection portions are set up set that they are of a mirror surface structure (top and bottom symmetrical structure).

2. Resin Fill Between Substrates

A fill resin (underfill) 62 is filled between the upper substrate 12U and the lower substrate 12L (FIG. 12(B)). That being the case, it is preferred that the end faces of the filler resin (underfill) 62 is also in a linear configuration with respect to the substrates. As for a resin to be filled between the substrates, either of a thermosetting resin, a thermoplastic resin, or a photosensitive resin may be used. Specifically, a resin composed of one or more kinds of resins such as epoxy resin, polyimide resin, phenol resin, etc., may be used. Inorganic, etc., particulates may be contained in those resins. And, it may be the same resin as or a different resin from the underfill 60. In addition, in lieu of resin fill, the both faces of the interposer 12M could be coated with a resin 90, as illustrated in FIG. 11(G), such that the space between upper substrate 12U and the lower substrate 12L is sealed with said resin 90.

As necessary, solder bumps 64L may be formed on the pads 42D of the lower substrate 12L (FIG. 12(B)). On the pad group of the pads 42P on the upper portion of the upper substrate 12U, a package substrate 70 with an IC chip 71 embedded therein or mounted thereon may be mounted (FIG. 13(A)). That provides a laminate package substrate structure having two or more IC chips 50, 71. While solder bumps or BGA was herein used as external terminals, connections pins (PGA) may be used. And, it can be connected to the pads 76 of the printed wiring board 74 via solder bumps 64L or a BGA formed on the pad group of the pads 42L of the lower substrate 12L, allowing said combination substrate 10 to be connected to the printed wiring substrate 74 (FIG. 13(B)).

As to the example described above with reference to FIG. 14(A), the pad group of the pads 42P for package substrate mounting may be formed round and disposed in the center region or the outer peripheral region of the upper substrate 12U. This allows a package substrate with the external terminals such as a BGA disposed to be placed only in the center region or the outer-peripheral region.

Figure 14:
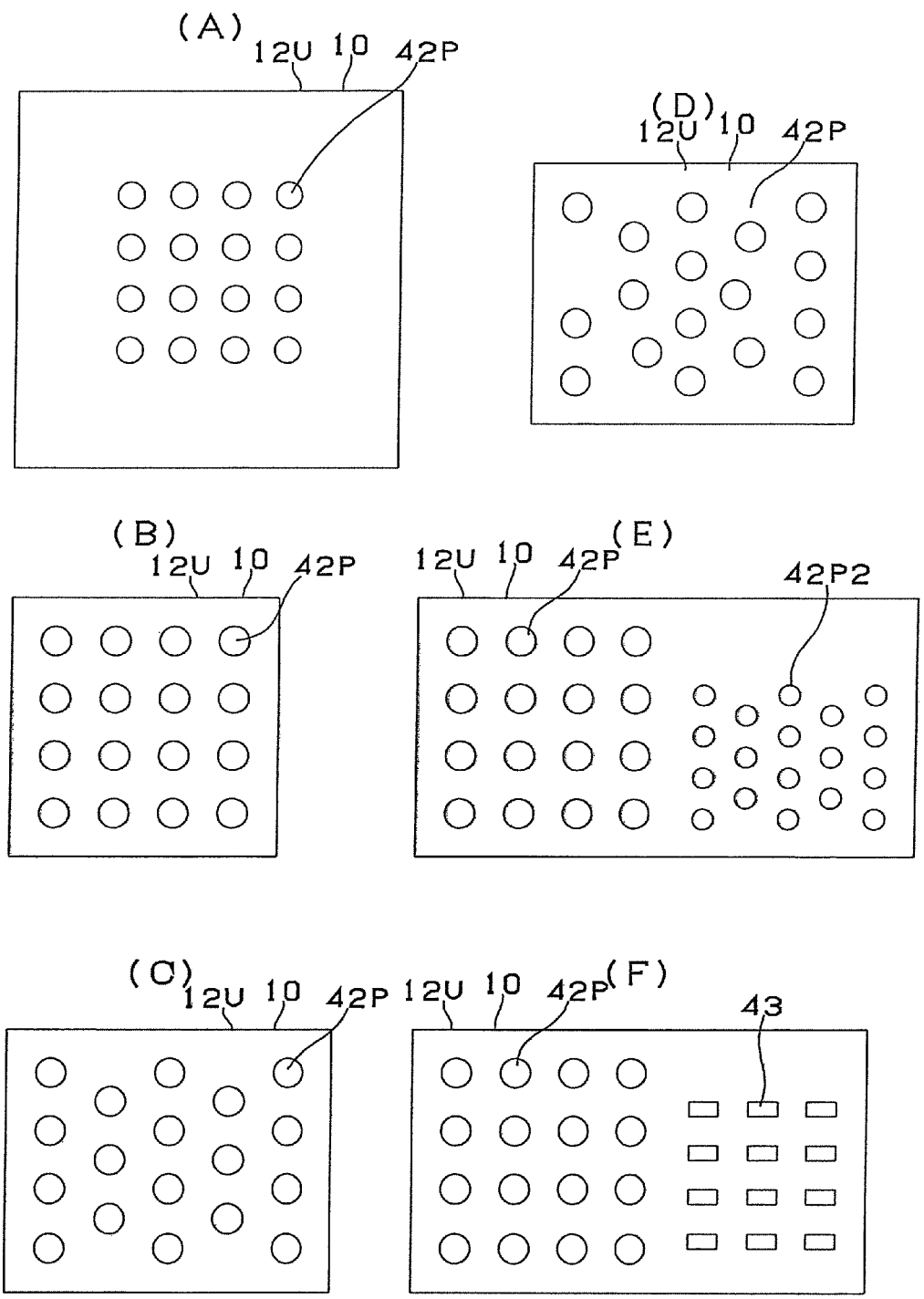
FIGS. 14A-14F are plan views illustrating the dispositions of pads for mounting a package substrate of a combination substrate in accordance with Example 2.

As illustrated in FIG. 14(B), FIG. 14(C), the pad group of the pads 42P for package substrate mounting may be disposed on nearly the entirety of the face of the upper substrate 12U. This allows a package substrate with the external terminals such as a BGA being disposed in a full grid pattern to be placed.

As illustrated in FIG. 14(B), FIG. 14(C), the pad group of the pads 42P for package substrate mounting may be disposed evenly-spaced and regularly.

As illustrated in FIG. 14(B), the pad group P of pads 42 for package substrate mounting may be disposed in a matrix pattern.

As illustrated in FIG. 14(C), the pad group of pads 42P for package substrate mounting may be disposed in a lattice pattern.

As illustrated in FIG. 14(D), the pad group of pads 42P for package substrate mounting may be disposed randomly. And, further, as to the pads for package substrate mounting, they may be two types of pads 42P, 42P2 for mounting two or more package substrates. Further, as illustrated in FIG. 14(F), on the upper substrate 12U there may also be provided pads 43 for electronic component mounting along with pads 42P.

Figure 15:
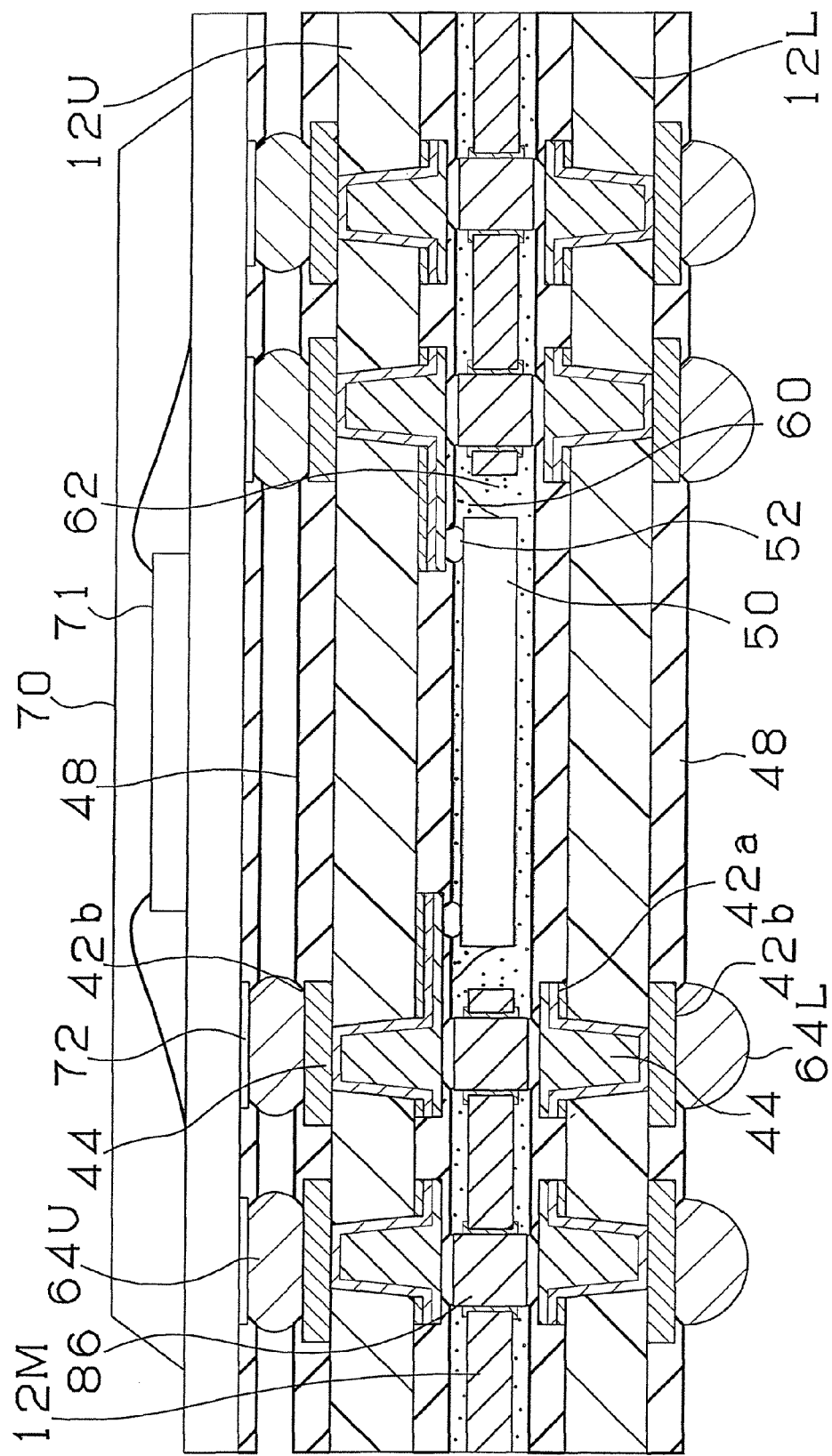
FIG. 15 is a sectional view illustrating a section of a combination substrate pertaining to Revised Example 1 of Example 2.

FIG. 15 illustrates a combination substrate pertaining to Revised Example 1 of Example 2. With Example 2, an IC chip 50 was mounted on the upper face of the lower substrate 12L as illustrated in FIG. 13(A). In lieu of this, an IC chip may also be mounted on the lower face of the upper substrate 12U, as illustrated in FIG. 15.

Figure 16:
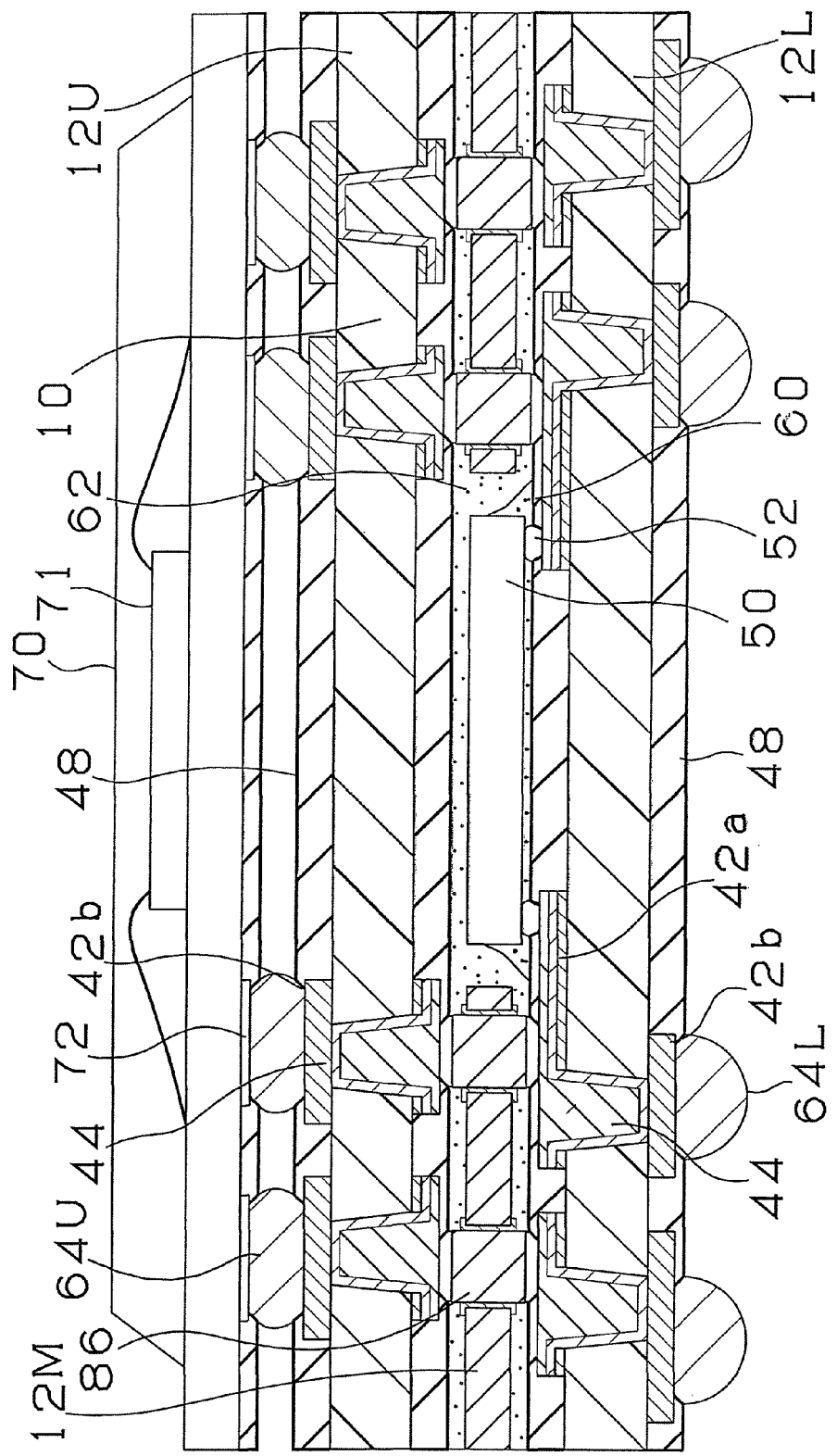
FIG. 16 is a sectional view illustrating a section of a combination substrate pertaining to Revised Example 2 of Example 2.

FIG. 16 illustrates a combination substrate pertaining to Revised Example 2 of Example 1. With Example 1, the upper substrate 12U and the lower substrate 12L were set up such that they were of a mirror surface structure. In lieu of this, it may be disposed such that vias 66 and circuits 42b of the lower substrate 12L spread out (fan out) as illustrated in FIG. 16.

According to the foregoing embodiments, a combination substrate includes a lower substrate having the first main face and the second main face opposite the previously-described first main face; connection pads formed on the first face of the previously-described lower substrate; mounting pads formed on the second main face of the previously-described lower substrate and for connecting with a printed wiring board; an upper substrate having the first main face and the second main face opposite the previously-described first main face; mounting pads formed on the first main face of the previously-described upper substrate and for loading a package substrate; component loading pads formed on the second main face of the previously-described upper substrate or on the first main face of the previously-described lower substrate and for loading an electronic component; and connection pads formed on the second main face of the previously-described upper substrate and for electrically connecting with the connection pads of the previously-described lower substrate. The first main face of the previously-described lower substrate and the second main face of the previously-described upper substrate mutually face and a resin is filled between the previously-described lower substrate and the previously-described upper substrate.

The above-described constitution allows electrical connectivity to be more readily secured. On account of a resin having been filled between the upper substrate and the lower substrate, it now becomes possible to control the warpage and separation of the upper substrate and the lower substrate and to ease stresses on account of the resin even when the upper substrate and the lower substrate are heated such that stresses are generated toward warpage and separation being generated. In other words, the stresses are eased. Accordingly, it is speculated that problems such as cracks becoming less susceptible to occur at the insulating materials of the substrates and the conductor layers on the substrates, etc., and that it becomes for electrical connectivity to be more readily secured.

And, a reliability rest is conducted under the conditions of high temperature and high humidity, PCT (conditions such as 2 atm, 121° C., 100% RH, etc.), etc. In particular, it is speculated on an accelerated test and a reliability test under the test conditions under which reliability is obtainable over a short period of time. As a result of this, a combination substrate comprising a upper substrate and a lower substrate in the present application allows reliability to be readily secured. Under the reliability conditions, stresses are generated resulting from the expansion and contraction of the materials due to factors such as heat. The impact of the force generated by those stress is reduced which makes possible for the degradation of the material to be eased. As a result of it, it is speculated that the degradation rate due to the intrusion of moisture from a conductor circuit and from the outside is slowed down allowing reliability to be readily secured.

Further, the previously-described resin may include a thermosetting resin and an inorganic filler. The previously-described resin may be an underfill agent. The mounting pads of the upper substrate may be formed on nearly the entirety of the face of the upper substrate. The mounting pads of the previously-described upper substrate may be disposed evenly-spaced and regularly. The mounting pads of the previously-described upper substrate may be disposed in a matrix-pattern or in a lattice-pattern. The mounting pads of the previously-described upper substrate may be disposed randomly. The mounting pads of the previously-described upper substrate may be pads for mounting two or more package substrates. The mounting pads of the previously-described upper substrate may be round. There may be formed pads for mounting a passive component on the previously-described first face of the previously-described upper substrate. The previously-described upper substrate may be connected via metal parts.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A combination substrate comprising:
   a first substrate;
   a second substrate aligned with the first substrate;
   an electronic component positioned between the first substrate and the second substrate; and
   a plurality of conductive posts forming a space which accommodates the electronic component between the first substrate and the second substrate, the plurality of conductive posts comprising a plurality of first posts formed on the first substrate and a plurality of second posts formed on the second substrate, the plurality of first posts and the plurality of second posts being joined by a conductive material coated on top and side surfaces of one of the plurality of first posts and the plurality of second posts,
   wherein one of the first substrate and the second substrate has a plurality of component loading pads formed on the one of the first substrate and the second substrate and positioned to load the electronic component between the first substrate and the second substrate, the first substrate has a plurality of wiring board mounting pads for installing a printed wiring board and a plurality of connection pads on an opposite side of the plurality of wiring board mounting pads, the second substrate has a plurality of package substrate mounting pads for loading at least one package substrate and a plurality of connection pads on an opposite side of the plurality of package substrate mounting pads, the plurality of conductive posts is electrically connecting the connection pads of the second substrate and the connection pads of the first substrate, and the space between the first substrate and the second substrate is filled with a resin component.

2. The combination substrate according to claim 1, wherein the resin component comprises a thermosetting resin and an inorganic filler.

3. The combination substrate according to claim 1, wherein the resin component comprises an underfill agent.

4. The combination substrate according to claim 1, wherein the package substrate mounting pads are positioned on substantially an entire surface of the second substrate.

5. The combination substrate according to claim 1, wherein the package substrate mounting pads are regularly positioned and evenly spaced.

6. The combination substrate according to claim 1, wherein the package substrate mounting pads are positioned in one of a matrix pattern and a lattice pattern.

7. The combination substrate according to claim 1, wherein the package substrate mounting pads are randomly positioned.

8. The combination substrate according to claim 1, wherein the package substrate mounting pads are positioned to mount a plurality of package substrates.

9. The combination substrate according to claim 1, wherein the package substrate mounting pads are round.

10. The combination substrate according to claim 1, further comprising a plurality of pads for mounting a passive component on the second substrate, wherein the pads for mounting a passive component is provided on a same side of the package substrate mounting pads.

11. The combination substrate according to claim 1, wherein the plurality of first posts comprises a plurality of metal components, respectively, comprising at least one metal selected from the group consisting of copper, nickel, gold and silver, and the plurality of second posts comprises a plurality of metal components, respectively, comprising at least one metal selected from the group consisting of copper, nickel, gold and silver.

12. The combination substrate according to claim 1, wherein the conductive material comprises a conductive adhesive.

13. The combination substrate according to claim 1, wherein the conductive material comprises a solder.

14. The combination substrate according to claim 1, wherein the plurality of posts comprises a plurality of metal layers electroplated on the connection pads of the first substrate and the second substrate.

15. The combination substrate according to claim 1, wherein the first substrate has a plurality of vias connecting the wiring board mounting pads and the connection pads in the first substrate, and the second substrate has a plurality of vias connecting the package substrate mounting pads and the connection pads in the second substrate.

* * * * *

UNITED STATES PATENT AND TRADEMARK OFFICE
CERTIFICATE OF CORRECTION

PATENT NO. : 8,618,669 B2  
APPLICATION NO. : 12/174212  
DATED : December 31, 2013  
INVENTOR(S) : Toru Furuta It is certified that error appears in the above-identified patent and that said Letters Patent is hereby corrected as shown below:

On the title page, Item (73), the Assignee's Information is incorrect. Item (73) should read:

--(73)   Assignee:   Ibiden Co., Ltd., Ogaki-shi (JP)--

Signed and Sealed this  
Twenty-fifth Day of March, 2014

Michelle K. Lee  
*Deputy Director of the United States Patent and Trademark Office*